United States Patent
Rapoport (12)

(10) Patent No.: US 6,281,775 B1
(45) Date of Patent: Aug. 28, 2001

(54) PERMANENT MAGNET ARRANGEMENT WITH BACKING PLATE

(76) Inventor: Uri Rapoport, Meshek 17, Moshav Ben-Shemen, 73115 (IL)

( * ) Notice: Subject to any disclaimer, the term of this patent is extended or adjusted under 35 U.S.C. 154(b) by 0 days.

(21) Appl. No.: 09/388,836

(22) Filed: Sep. 1, 1999

Related U.S. Application Data

(60) Provisional application No. 60/098,699, filed on Sep. 1, 1998.

(51) Int. Cl.[7] .............................. H01F 7/02; H01F 3/00; G01V 3/00
(52) U.S. Cl. ................... 335/306; 335/297; 335/298; 335/296; 324/319; 324/320
(58) Field of Search ................................. 335/296–306; 324/318, 319, 320

(56) References Cited

U.S. PATENT DOCUMENTS

| | | | | |
|---|---|---|---|---|
| 3,018,422 | * | 9/1997 | Seaton | 335/298 |
| 5,666,056 | * | 9/1997 | Cuppen | 324/318 |
| 5,900,793 | * | 5/1999 | Katznelson et al. | 335/296 |

* cited by examiner

Primary Examiner—Ramon M. Barrera
(74) Attorney, Agent, or Firm—Jerry A. Schulman

(57) ABSTRACT

A permanent magnet arrangement has a pair of permanent magnet groupings supported by a C-shaped yoke. Each magnet grouping comprises a series of circular, concentrically-arranged permanent magnets in a support frame. An adjusting mechanism allows each circular magnet to be individually aligned and adjusted with respect to the remaining magnets. The circular magnets can be formed as solid disks, toroidal solids or from individual magnet elements arranged in circular rings. A backing plate supports each magnet grouping and attaches the grouping to the yoke.

2 Claims, 4 Drawing Sheets

PERMANENT MAGNET ARRANGEMENT WITH BACKING PLATE

Priority is claimed based upon Provisional Application Serial No. 60/098,699 entitled "Permanent Magnet Arrangement with Backing Plate", filed Sep. 1, 1998.

FIELD OF THE INVENTION

The present invention relates generally to permanent magnet arrangements for equipment used to conduct magnetic resonance imaging (MRI) examinations and, in particular, to a magnet arrangement which uses backplates to increase magnetic field strength and with which the alignment and position of individual magnets in the arrangement can be adjusted individually.

BACKGROUND OF THE INVENTION

Apparatus used for MRI diagnostic procedures require the use of large magnets to create the strong, uniform magnetic field required for accurate test results. An MRI unit must be of a size and configuration to enable a patient to place all or a substantial part of his or her body into that portion of the magnetic field found to be the strongest and most uniform.

A typical MRI apparatus features an opposed pair of magnet groupings supported by a generally C-shaped frame designed to hold the groupings in face-to-face parallel configuration. An air gap or space is defined between the magnet groupings where the patient is positioned. Each of the frame legs and cross members is made from a highly permeable ferromagnetic material to complete a circuit for the magnetic flux to travel from one magnet grouping across the air gap and returning to the remaining grouping.

Because the magnet groupings are quite heavy, it is necessary to construct the frame of sufficiently massive members to limit deflection of the frame not only by the weight of the magnets but the weight combined with the attractive force the magnet groupings exert on each other. The weight of the magnet groupings and the massiveness of the frames needed to support them can make MRI units costly and difficult to construct and inconvenient to move.

MRI units and the circular magnet groupings used in them are well represented in the prior art.

U.S. Pat. No. 5,623,241 (Minkoff) teaches and describes a permanent magnetic structure comprising a C-shaped frame which supports two opposed magnet groupings at the open end of the frame legs, thereby forming an air gap. The groupings in Minkoff are single-piece, permanent magnets arranged in parallel, face-to-face relationship, each magnet having a pole piece positioned on its outer face.

U.S. Pat. Nos. 4,943,774 and 5,134,374 (Breneman, et al.) teach and describe various magnetic field control apparatus. Both patents feature magnet groupings consisting of a permanent magnetic pole supported on a rear frame and having a pole face formed from ferrous material. Breneman, et al '774 utilizes a number of ferrous segments positioned on an annular member attached to one pole face, with the segments being radially repositionable to adjust the magnetic field strength and orientation. Breneman, et al '374 uses a series of segments applied directly to the pole faces to adjust the magnetic field.

U.S. Pat. No. 5,194,810 (Breneman, et al.) teaches and describes a superconducting MRI magnet with magnetic flux field homogeneity control which uses radially positioned circular segments as shims to adjust the magnetic field created between two magnet groupings.

U.S. Pat. No. 5,332,971 (Aubert) teaches and describes a permanent magnet for nuclear magnetic resonance imaging equipment utilizing a number of magnetic blocks arranged into concentric rings to produce a homogeneous magnetic field.

U.S. Pat. No. 5,659,250 (Domigan, et al.) teaches and describes a full brick construction of magnet assembly having a central bore in which a plurality of individually magnetized bricks are arranged in elliptically shaped sections to create a bore within which a patient can be placed for MRI examination. The individual bricks are formed as parallelepiped and the field is adjusted by the shapes of the groupings of bricks used.

U.S. Pat. No. 4,998,084 (Alff) teaches and describes a multipolar magnetic ring consisting of two rings having magnetic segments formed about their inner peripheries which interengage to form a single ring.

U.S. Pat. No. 4,734,253 (Sato, et al.) teaches and describes a method for the preparation of sintered magnets from Fe-B rare earth alloy with the sintered magnetic segments arranged to form a circular ring.

U.S. Pat. No. 4,538,130 (Gluckenstern, et al.) teaches and describes a tunable segmented ring magnet and method of manufacture whereby a circular ring of permanent magnetic segments is formed for use in NMR imaging systems.

U.S. Pat. No. 4,093,912 (Double, et al.) teaches and describes an NMR magnet assembly with pole face parallelism adjustment used to align the faces of magnetic pole pieces used in NMR magnet arrangements.

U.S. Pat. No. 5,028,903 (Aubert) teaches and describes a spherical permanent magnet with equatorial access consisting of a pair of hemispherical magnet arrangements creating therewithin an air gap for use in MRI procedures.

It is an object of the present invention to provide a permanent magnet arrangement for use in MRI equipment in which the strength of the magnetic field created by the magnets used in the arrangement is increased without significantly increasing the weight of the arrangement.

It is a further object of the present invention to provide a field-strengthening arrangement adaptable to a wide variety of magnet segment arrangements.

Yet another object of the present invention is to provide embodiments of the present invention that are inexpensive to construct and maintain.

An additional object of the present invention is to provide such magnetic field enhancements which take full advantage of the adjustability of concentric ring magnet arrangements.

BRIEF DESCRIPTION OF THE INVENTION

A permanent magnet arrangement adapted for use in MRI examinations has a generally C-shaped yoke formed from a magnetically conductive material such as soft steel. A pair of permanent magnet groupings is positioned at and joined to the open ends of the C-shaped yoke in parallel, spaced relationship to create an air gap therebetween within which a test subject is positioned to undergo MRI examination. In a preferred embodiment, each magnet arrangement consists of a series of concentrically-arranged ring-shaped or disk-shaped magnets which are mechanically adjustable to maximize magnetic field uniformity across the air gap. Each magnet grouping is attached to a backplate which, in turn, is attached to the C-shaped yoke. The adjusting mechanism allows each magnet to be adjusted individually and forms a magnetically-conductive path from each magnet to the backplate and, thereby, through the yoke and across the air gap.

While the following describes a preferred embodiment or embodiments of the present invention, it is to be understood that this description is made by way of example only and is not intended to limit the scope of the present invention. It is expected that alterations and further modifications, as well as other and further applications of the principles of the present invention will occur to others skilled in the art to which the invention relates and, while differing from the foregoing, remain within the spirit and scope of the present invention as herein described and claimed.

These and further objects of the present invention will become more apparent upon consideration of the accompanying drawings wherein:

DETAILED DESCRIPTION OF THE DRAWINGS

Figure 1:
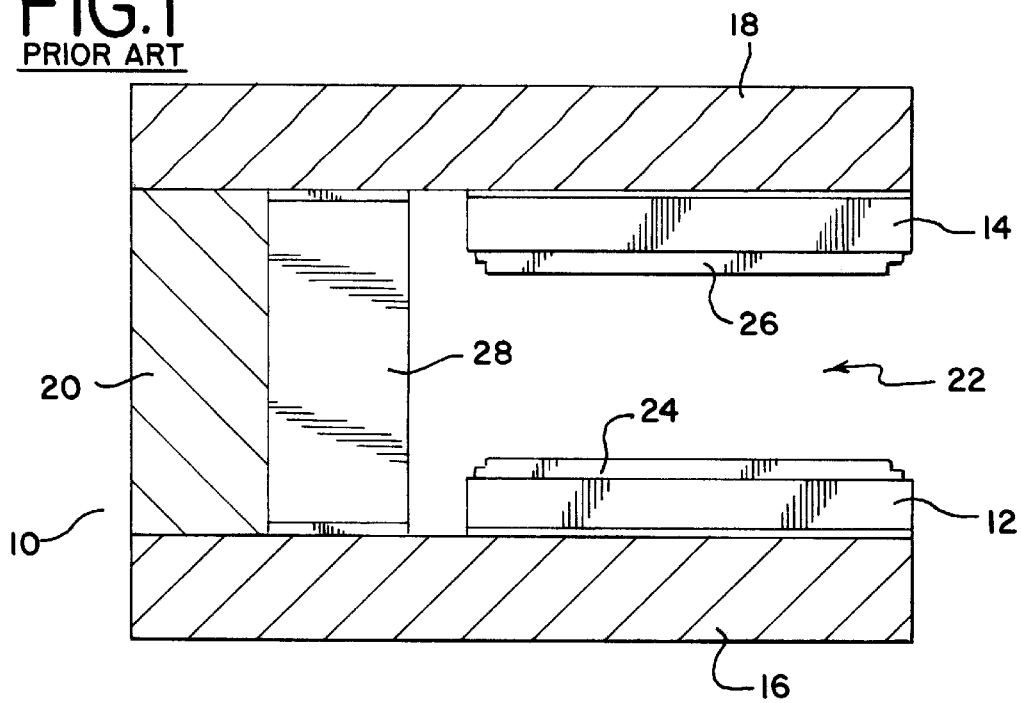
FIG. 1 is a prior art C-shaped permanent magnet arrangement.

Referring now to FIG. 1, the numeral 10 indicated generally a prior art C-shaped permanent magnet arrangement intended for use in connection with MRI equipment. A pair of permanent magnets 12, 14 are held in a generally U-shaped structure which includes a pair of support arms 16, 18 to which magnets 12, 14 are attached and which are joined by a cross piece 20. Support arms 16, 18 and cross piece 20 define a "yoke" configuration and are preferably manufactured from ferromagnetic material to create a magnetic circuit defined by magnet 12, arm 16, cross piece 20, arm 18, magnet 14 and an air gap 22 within which an article to be examined using MRI is placed.

In the prior art example shown, magnet 12 has a pole piece 24 positioned substantially coextensive with the face of magnet 12, while magnet 14 has a similar pole piece 26 positioned substantially coextensive with the face of magnet 14.

It is a teaching of the prior art that arms 16 and 18 be of sufficient length such that cross piece 20 does not introduce undesirable variations in the uniformity of the magnetic field extending across air gap 22. In the example shown, a reinforcing support 28 is also provided to hold arms 16 and 18 as close to parallel as possible, thereby making the faces of pole pieces 24 and 26 as close to parallel as possible. Any "sag" or other movement of one support arm toward the other whether through the action of gravity or magnetic attraction affects the uniformity of the magnetic field making MRI less precise.

Figure 2:
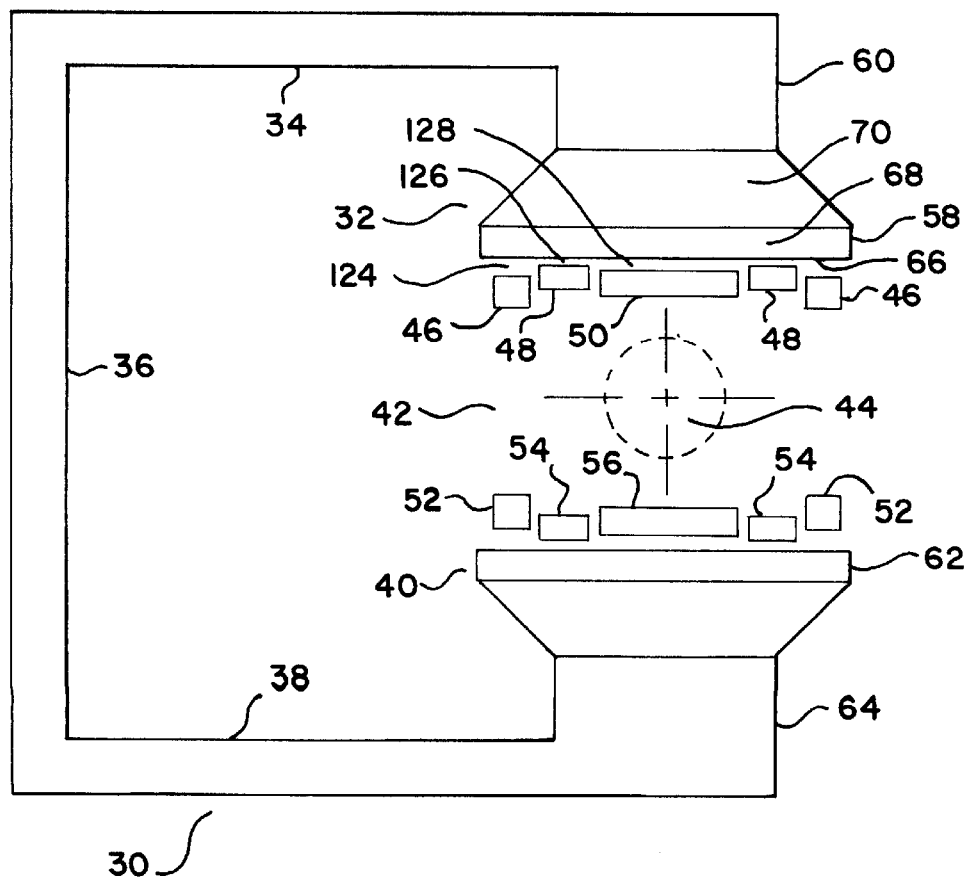
FIG. 2 is a front schematic view of a preferred embodiment of the present invention.

Referring to FIG. 2, a preferred embodiment of the present invention is shown schematically. As with the structure of FIG. 1, the magnet assembly 30 is generally C-shaped having a first magnet arrangement 32, a first cross arm 34, a support arm 36, a second support arm 38, and a second magnet arrangement 40, all arranged to create an air gap 42 within which an MRI test zone 44 is created.

Figure 3:
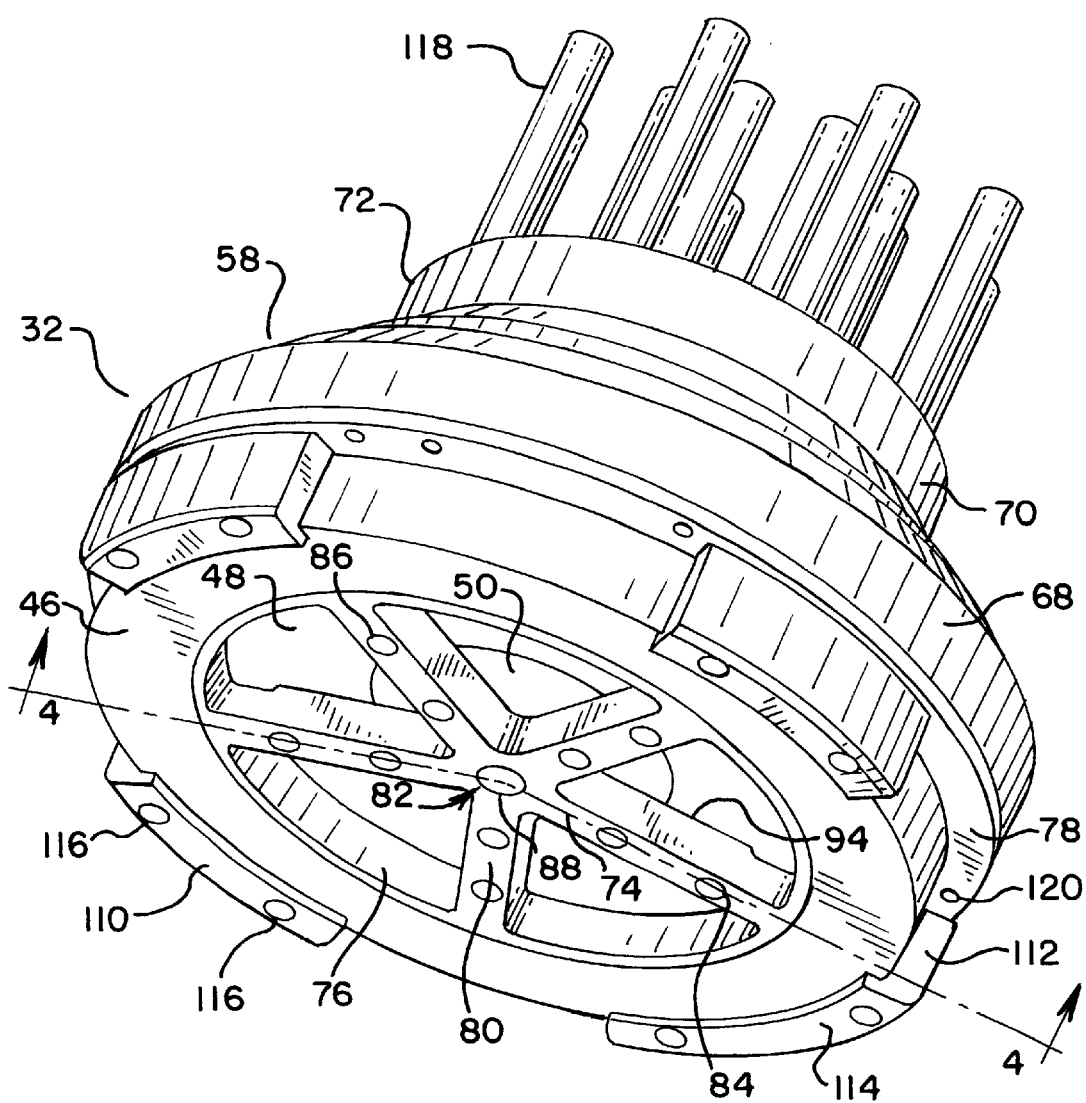
FIG. 3 is a perspective view of the magnet arrangement of FIG. 2 mounted in an adjusting apparatus attached to a backplate.

As seen in FIGS. 2 and 3, magnet arrangement 32 is preferably formed from a series of circular concentric magnets. In the example shown, arrangement 32 has an outer magnet 46, a middle magnet 48 and a central magnet 50. Although magnets 46 and 48 are herein shown as one-piece toroidal rings, and magnet 50 is shown as a one-piece disk, it is understood that magnets of this type may be constructed of a number of individual segments in accordance with the teachings of the prior-mentioned patents.

The magnets of arrangement 32 are shown schematically in FIG. 2 to demonstrate the each magnetic ring or element 46, 48, 50 is separately adjustable throughout a vertical length of travel in order to move each such element toward or away from air gap 42. Each such element is also adjustable in a horizontal plane to "tilt" each individual element in order to establish a parallel relationship with the magnets in arrangement 40.

As shown in FIG. 2, arrangement 40 consists of elements identical to those in arrangement 32, namely, an outer ring-shaped magnet 52, a middle ring-shaped magnet 54 and a central magnet 56. It is a feature of the present invention to include in each arrangement 32, 40 a structural element to strengthen the magnetic field present across air gap 42 and, in particular, across test zone 44, without the use of electrically powered elements and without the use of expensive, difficult to manufacture, magnetic elements.

As seen in FIG. 2, arrangement 32 includes a steel backplate 58 joined to support block 60 of yoke arm 34. In similar fashion, an identically shaped backplate 62 is attached to support end 64 of yoke arm 38.

It has been found that including back plates 58 and 62 in magnet arrangements 32 and 40, respectively, results in a strengthening of the magnetic field created across air gap 44 without requiring the use of such expedients as electrically powered auxiliary magnets or shim coils. For magnets with a given strength, the use of back plates 58 and 62 increases field uniformity and resolution yielding more sensitive and detailed MRI results.

As seen in FIG. 3, backplate 58 is preferably formed with at least one surface that overlaps the outer magnet 46 and is identical to the shape of outer magnet 46, that is, in the embodiment shown, backplate 58 has a circular face 66.

Figure 4:
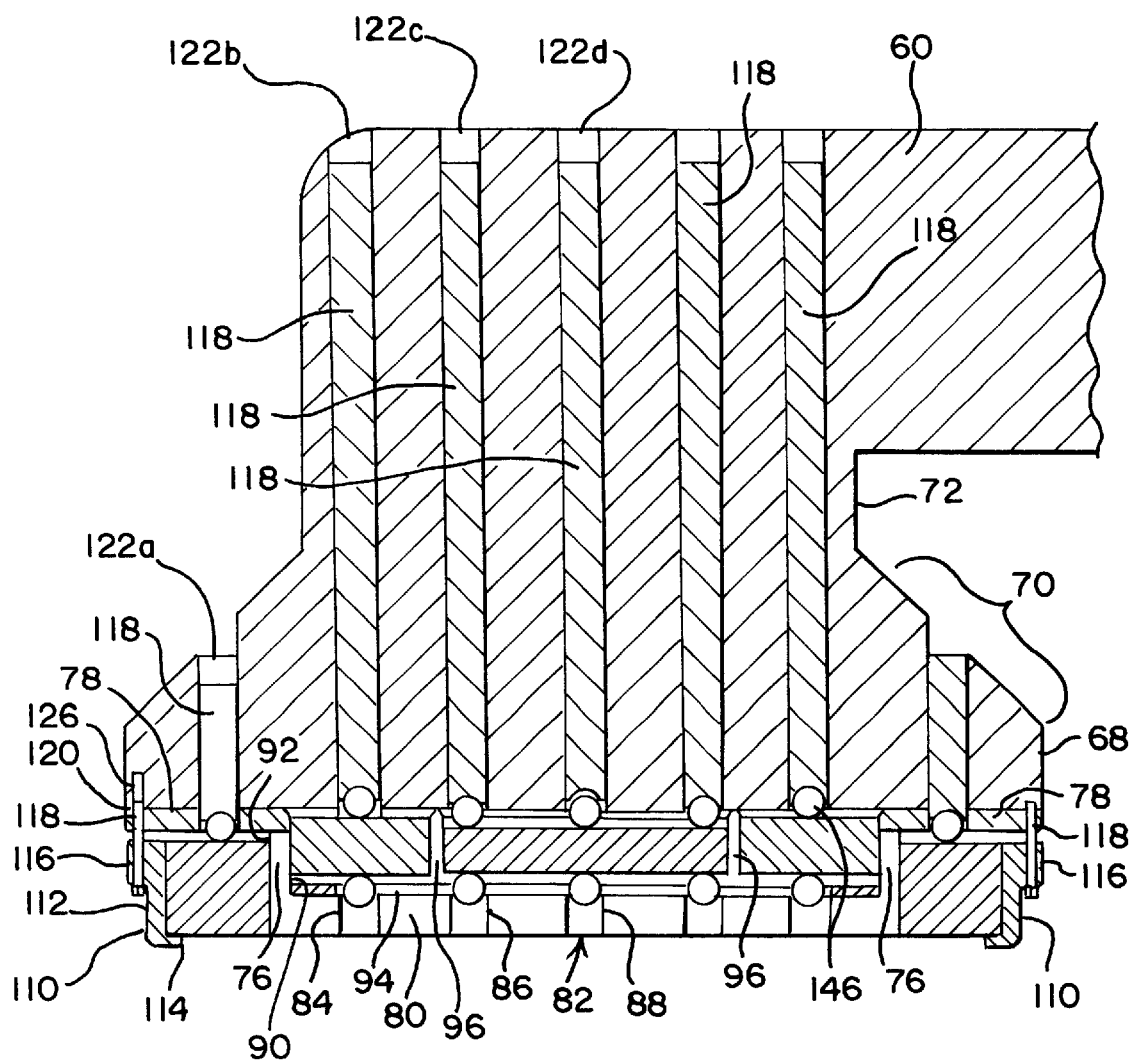
FIG. 4 is a sectional view taken along 4—4 of FIG. 3.

As seen in FIGS. 2, 3 and 4, a preferred embodiment of back plate 58 includes a first disk-shaped section 68 formed integrally with a stepped frustoconical section 70. As seen in FIGS. 3 and 4, an upper cylindrical section 72 is included, and is preferably sized and shaped to enable quick and secure attachment to support block 60.

FIGS. 3 and. 4 also illustrate in detail a mounting or nesting apparatus within which magnets 46, 48 and 50 are held and within which each said magnet is individually mechanically adjustable to move toward or away from air gap 42 and to angle each magnet individually to bring the faces of the magnets parallel to the magnets in the corresponding facing group (in this embodiment, magnets 52, 54 and 56).

As seen in FIGS. 3 and 4, the magnet support and adjusting apparatus includes a support frame or spider 74. As seen in FIG. 3 and in section in FIG. 4, frame 74 comprises an outer circular rim 76 terminating in and integral with a horizontally-extending flange 78. A series of spokes 80 extend radially outwardly from a hub portion 82 to form a "spider" with each spoke 80 joined to and formed integrally with outer rim 76.

On each spoke 80, a series of threaded apertures are formed. In the embodiment shown in FIG. 3, each spoke 80 includes two such apertures with a first threaded aperture 84 positioned proximate outer rim 76 and a second threaded aperture 86 positioned intermediate aperture 84 and hub portion 82. The embodiment depicted herein includes five such spokes 80. A threaded aperture 88 is also formed at hub portion 82.

As seen in FIG. 4, outer rim 76 has an inner surface 90 and an outer surface 92. Middle magnet 48 and central magnet 50 are nested within the space defined by inner surface 90 and the uppermost surface 94 of each spoke 80. A spacer 96 formed as an annular ring is disposed between middle magnet 48 and central magnet 50 and is formed with sufficient precision to assure a tight fit about the periphery of the outer periphery of central magnet 50 and the inner periphery of middle magnet 48. Spacer 96 may be formed as a separate part or may be formed as part of and integral with support frame 74.

Outer rim 76 is also formed with sufficient precision to provide a tight fit when inserted within and along the inner periphery of outer magnet 46, as shown in FIG. 4.

As seen in FIGS. 3 and 4, a series of mounting blocks 110 are positioned about the outer periphery of outer magnet 46. Each mounting block 110 has a vertically extending wall portion 112 and a horizontally extending foot portion 114 formed integrally with and generally at right angles to wall 112. As seen in FIG. 4, the lowermost surface of outer magnet 46 is contacted and supported by foot 114 while the outermost surface of outer magnet 56 is contacted by the innermost surface of wall 112.

A series of mounting apertures 116 extend through wall 112 to provide a passage through which a series of mounting screws 118 is inserted to align with and be threaded into a selected one of a series of threaded apertures 120 formed in flange 78. As seen in FIG. 3, each mounting block 110 has a pair of mounting apertures 116 and said apertures are sized and positioned to register with selected apertures 120. A series of mounting blocks 110 is thus mounted to flange 78 to hold outer magnet 46 in place.

FIG. 3 illustrates the use of four such mounting blocks 110. It should be understood that any selected number of said mounting blocks may be used or provided as desired. It is also contemplated that a single mounting ring which would extend around the entire underside of flange 78 may also be used, with such a ring being fastened in place through use of the same type of fasteners.

It is also contemplated that apertures 126 corresponding to apertures 120 be formed through back plate 58, and that mounting screws 118 may be threaded into such apertures as well to hold mounting blocks 110 in place to support outer magnet 46.

Figure 6:
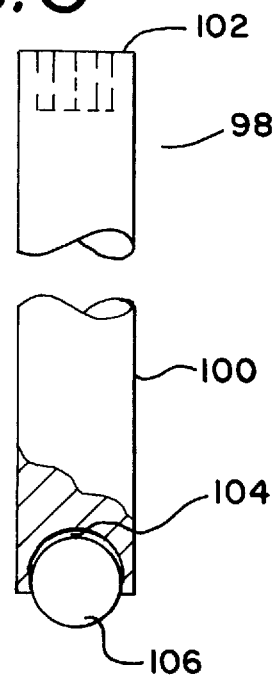
FIG. 6 is a partial sectional view of an adjusting screw.

As shown in FIG. 6, an adjusting screw 98 has an externally threaded shaft 100 terminating at one end in a head 102. A semi-spherical cavity 104 is formed at the remaining end of shaft 100 within which a ball or roller 106 is press fit allowing ball 106 to rotate freely within cavity 104. Preferably, ball 106 is formed from a durable, non-ferrous material such as Delrin®.

Figure 7:
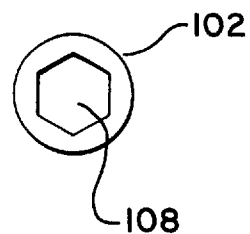
FIG. 7 is a top plan view of the head of an adjusting screw.

As seen in FIG. 7, head 102 has a channel or slot 108 formed axially therethrough to enable screw 98 to be rotated by a selected tool. In the embodiment shown herein, channel 108 is hexagonal in shape to form a hexagonal cylindrical shaft into which a standard alien wrench or key may be inserted to effect rotation of screw 98. The diameter and screw pitch of shaft 100 are selected to enable screw 98 to be threaded into threaded apertures formed through back-plates 58 and 62.

Figure 5:
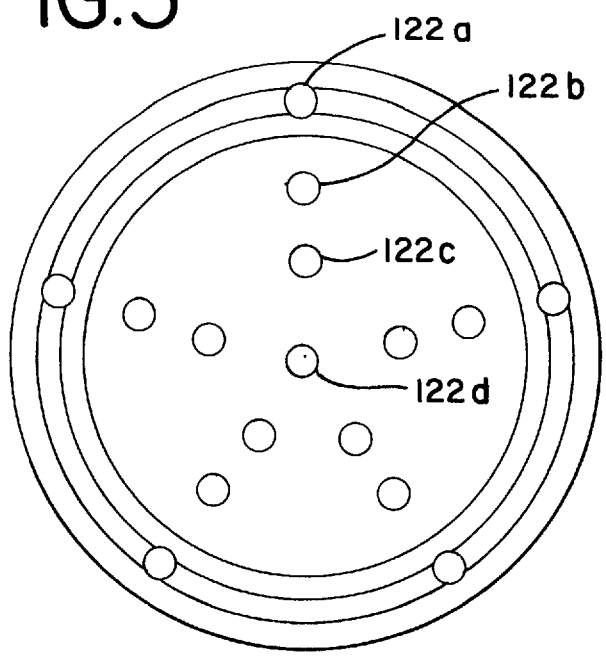
FIG. 5 is a top plan view of the upper surface of the backplate shown in FIG. 3.

Referring now to FIGS. 3, 4 and 5 the adjustment of central magnet 50 and middle magnet 48 within support frame 74 may now be described. Each threaded aperture 84, 86 and 88 has an adjusting screw 98 threaded upwardly therethrough to bring ball 106 into contact with, respectively, the lower surface of middle magnet 48 and central magnet 50. In the embodiment shown in FIG. 3, outer and middle magnets 46 and 48 are contacted and supported by five such adjusting screws while center magnet 50 is contacted and supported by six adjusting screws. Rotating each such screw to drive it upward produces a corresponding upward movement in the magnet contacted by the ball 106 of each adjusting screw 98. It can also be seen that threading certain of said adjusting screws upward to a higher position than that of other said screws contacting the same magnet will not only adjust the height but the angle of that particular magnet. In this manner, not only the distance from air gap 42 but the angle at which each such magnet presents itself to air gap 42 is adjustable. The use of such an adjusting system is known in the art as exemplified, for example, by U.S. Pat. No. 4,093,912, in which an adjusting mechanism is shown intended to allow magnets used in a MRI arrangement to be adjusted to bring the magnet pole pieces into parallel relationship.

In FIGS. 4 and 5, it can also be seen that a second series of adjusting screws 118 are threaded through back plate 58 through a series of threaded apertures 122a, 122b, 122c and 122d. Apertures 122a–d are positioned to allow a series of adjusting screws 118, identical in construction to screws 98 but different in length, to extend downward such that the balls 146 of adjusting screws 118 contact the uppermost surfaces of middle magnet 48 and central magnet 50, respectively. Such a construction has several advantages. One advantage is that magnets 48 and 50 are stabilized by being "clamped" between adjusting screws 98 and 118. Another advantage is that the construction shown in FIGS. 3 and 4, while illustrating an upper magnet assembly, can function equally well as a lower magnet assembly. When turned upside down, adjusting screws 118 support magnets 48 and 50 while adjusting screws 98 act as the clamping or stabilizing elements.

Preferably, support frame 74 is manufactured from a non-ferromagnetic material of sufficient strength to support magnets 46, 48 and 50 and provide a material within which apertures may be formed. Examples of such materials are aluminum and such phenolic materials as Delrin®, graphite and Bakelite. Use of rotating balls 106 and 146 provides a nonmarring contact material with magnets 46, 48 and 50, an important consideration when it is desired to keep the precisely manufactured and tolerance surfaces of magnets 46, 48 and 50 unmarked.

As seen schematically in FIG. 4, adjusting screws 98 are also threaded through back plate 58 to contact the uppermost surfaces of outer magnets 46, thus providing a stabilizing effect. As discussed hereinabove, when the magnet arrangement shown in FIG. 4 is used as a lower magnet arrangement, outer magnet arrangements are then supported by adjusting screws 18.

Referring to FIGS. 3 and 4 demonstrates that the operation of the present invention does not rest upon metal-to-metal contact throughout the C-shaped frame to create the desired magnetic field across air gap 42. FIG. 2 shows schematically that adjusting magnets 46, 48, 50, 52, 54 and 56 results in the creation of air gaps between said magnets and backplates 32 and 40. As an example, when adjusted to the positions shown in FIG. 2, outer magnet 46 is separated from backplate 32 by an air gap 124, middle magnet 48 is separated by an air gap 126 and center magnet 50 is spaced from backplate 32 by air gap 128. Such gaps may be on the order of several millimeters to several centimeters in size, depending upon the size and configuration of the magnets involved.

The freedom to adjust the positions of magnets 46, 48 and 50 independently allows the magnet arrangement to be configured uniquely to optimize the magnetic field strength and uniformity across air gap 42. Variations in strength, configuration and composition of individual magnets can be compensated for by adjusting the tilt and positions of the magnets with respect to each other and to air gap 42. Once a device using one or more of the magnet arrangements disclosed herein is placed in position for use, the device can then be set up or optimized by adjusting the individual magnets. Should the device incur shocks or impacts, it can readily be adjusted to correct any physical misalignment that may have occurred.

Figure 8:
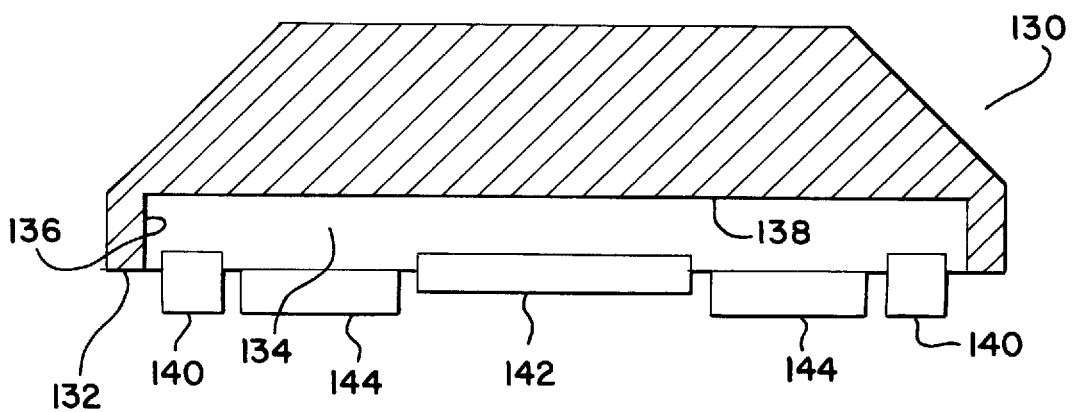
FIG. 8 is a schematic view of a backplate with a recessed face.

Another possibility created by the adjustability of the individual magnets is the use of a backplate having a face cavity formed thereon which allows individual magnets to be adjusted into the backplate. In FIG. 8, such a backplate 130 is shown schematically.

Backplate 130 has a face 132 within which a cavity 134 has been formed. For purposes of example, cavity 134 is formed in the shape of a right circular cylinder with an inner peripheral wall 136 and a cavity ceiling 138, it being understood that other configurations may be selected as well. An outer magnet 140 and a center magnet 142 are shown adjusted to bring at least a portion of each such magnet into cavity 132, while a middle magnet 144 is shown as adjusted to lie outside cavity 134.

Throughout the foregoing examples the present invention has been demonstrated through the use of three circular magnets in each magnet arrangement. It should be clearly stated that the number and configuration of the magnets used in the disclosed arrangements is wholly within the discretion of the designer and the present invention can readily be adapted to other configurations. While the use of such magnet arrangements in MRI examinations is an excellent example of a use to which such an arrangement can be put, it is by no means the only such use. Any device calling for the use of a permanent magnet arrangement will find utility in the present invention.

What is claimed is:

1. A permanent magnet structure, comprising:

first and second permanent magnet groupings;

a generally C-shaped yoke formed from magnetically permeable material, said yoke holding said magnet groupings in fixed, substantially parallel spatial relationship;

an air gap defined by the spacing apart of said magnet groupings;

each said magnet grouping comprising at least two circular magnets in a concentric array, each said circular magnet having a front surface and a rear surface, with each said front surface facing toward said air gap;

means for adjusting said circular magnets individually in a generally axial direction toward or away from said air gap, said adjusting means includes a support frame;

a series of axially adjustable support shafts threadably attached to said frame with a first set of said shafts contacting said magnet front surfaces and a second set of said shafts contacting said magnet rear surfaces, whereby said magnets are adjusted to move toward said air gap by moving said first and second sets of adjusting shafts toward said air gap and said magnets are adjusted to move away from said air gap by moving said first and second set of adjusting shafts away from said air gap; and first and second backing plates, each said backing plate supporting one said magnet grouping and securing said magnet grouping to said yoke.

2. The apparatus as recited in claim 1 wherein said adjusting frame and said shafts are formed from non-ferromagnetic material.

\* \* \* \* \*